United States Patent [19]

Lambert

[11] Patent Number: 4,797,113

[45] Date of Patent: Jan. 10, 1989

[54] BOARD TO BOARD FLEXIBLE PIN

[76] Inventor: Roger T. Lambert, 5164 St. Moritz Dr., Fridley, Minn. 55421

[21] Appl. No.: 11,030

[22] Filed: Feb. 5, 1987

[51] Int. Cl.⁴ .......................................... H01R 13/28
[52] U.S. Cl. ...................................... 439/74; 439/82; 439/295
[58] Field of Search .......... 339/17 C, 17 LM, 17 M, 339/220 R, 221 R, 221 M, 252 P; 439/74, 75, 78-84, 284, 290, 291, 295, 751, 825-827, 844, 853, 869, 873, 292-294

[56] References Cited

U.S. PATENT DOCUMENTS

| | | | |
|---|---|---|---|
| 2,814,024 | 11/1957 | Narozny | 339/220 R |
| 2,913,634 | 11/1959 | Scoville | 339/17 M |
| 3,008,118 | 11/1961 | Mavity | 439/877 |
| 3,123,427 | 3/1964 | Yopp | 439/825 |
| 3,252,127 | 5/1966 | Woodward | 439/746 |
| 3,268,774 | 8/1966 | Ortner | 339/17 M |
| 3,277,422 | 10/1966 | Shevlin | 439/381 |
| 3,286,671 | 11/1966 | Fuller | 439/825 |
| 3,545,080 | 12/1970 | Evans | 29/874 |
| 3,581,272 | 5/1971 | Yopp et al. | 439/825 |
| 3,621,445 | 11/1971 | Horecky | 174/68.5 |
| 3,665,378 | 5/1972 | Hammell et al. | 439/748 |
| 3,750,092 | 7/1973 | Bury | 219/251 |
| 3,777,303 | 12/1973 | McDonough | 29/626 |
| 3,783,433 | 1/1974 | Kurtz et al. | 439/82 |
| 3,786,558 | 1/1974 | McCarthy | 439/825 |
| 3,803,537 | 4/1974 | Cobaugh et al. | 439/844 |
| 3,808,588 | 4/1974 | McGregor | 439/872 |
| 3,924,921 | 12/1975 | Feightner | 439/825 |
| 3,941,449 | 3/1976 | Baumanis | 439/872 |
| 3,958,859 | 5/1976 | Schmid | 439/746 |
| 4,133,599 | 1/1979 | Powell | 439/843 |
| 4,149,764 | 4/1979 | Mattinghy, Jr. | 339/17 M |
| 4,168,878 | 9/1979 | Risser et al. | 439/200 |
| 4,169,654 | 10/1979 | Plyler et al. | 439/825 |
| 4,239,321 | 12/1980 | Bauer | 439/872 |
| 4,437,726 | 3/1984 | Lambert | 439/825 |
| 4,513,499 | 4/1985 | Roldan | 439/869 |
| 4,516,816 | 5/1985 | Winthrop, Jr. | 339/17 M |
| 4,533,200 | 8/1985 | Wilson | 339/221 M |

FOREIGN PATENT DOCUMENTS 2023188 11/1970 Fed. Rep. of Germany ...... 439/284

OTHER PUBLICATIONS

Pomona Electronics, Catalog, pp. 527–530.
Elco Corporation Ad, "The Microminiature No-Twist Pin".
Cannon ITT Ad, MMC-7/Nov. 1981, "Microminiature Connectors".

Primary Examiner—Gil Weidenfeld
Assistant Examiner—Gary F. Paumen
Attorney, Agent, or Firm—Schroeder & Siegfried

[57] ABSTRACT

A flexible, hollow electrical connector includes an end barrel portion which receives a second, identical connector, an intermediate portion positionable through a bore in a circuit board and a third contact portion. The contact portion comprises a pair of longitudinal fingers disposed in confronting relationship, each finger having a curved configuration in which the greatest transverse projection is at least as great as the inside diameter of the end barrel portion. Some embodiments may eliminate the intermediate portion and insert the barrel portion in the circuit board.

9 Claims, 2 Drawing Sheets

BOARD TO BOARD FLEXIBLE PIN

BACKGROUND OF THE INVENTION

1. Field of the Invention

This invention relates to the field of electrical connectors and more particularly to the field of a flexible pin used in connecting two circuit boards together. The flexible pins mate with a like pin rather than with a receiving connector in a board or chip.

2. Description of the Prior Art

Low resistance, stable electrical connections having a disconnect function have been provided by pin and socket constructions. One of the connector members is comprised of a plurality of resilient finger members which are suitably deformed to engage the other socket member under spring pressure. Several components have been interconnected using a pin and socket construction. U.S. Pat. No. 3,286,671 to G. A. Fuller exemplifies prior art using pin and socket connectors. A male deformable pin attached to one piece is inserted into a female socket attached to a second piece. Female socket construction for printed circuit boards is exemplified by U.S. Pat. No. 3,777,303 to McDonough. A lead or pin is inserted through a socket placed in the printed circuit board.

BRIEF SUMMARY OF THE INVENTION

The board to board contact of the invention is preferably made from a ribbon of metal combining high electrical conductivity, good formability and high strength. One such metal by way of example is beryllium copper having a thickness of 0.0045 inches and the further characteristic of being formed of one-quarter hard temper and subsequently heat treated for greater strength. The contact generally includes three portions defining a longitudinal axis. The first portion has a generally barrel shape in which the lateral edges are bent towards each other until they are in close proximity to each other. The inside diameter of the first portion is approximately 0.0225 inches.

The second portion of the contact communicates with the first barrel shaped portion and has a similar barrel shape in which a shoulder or step with a 45° incline joins the first and second portions such that the second portion outside diameter is substantially equal to the inside diameter of the barrel of the first portion. The second portion is inserted into a bore in a circuit board with the shoulder or step acting as a stop or depth guide.

The third portion of the board to board contact forms the pin portion of the contact. A pair of fingers extend parallel to a longitudinal axis and are cantilevered and integrally formed from the second portion. The fingers are disposed in confronting relationship, preferably as mirror images of each other with each finger having a curved configuration in which the greatest transverse projection is greater than the inside diameter of its mating barrel portion. Each of the edges of the fingers preferably have coined edges. As viewed from a plan view, the fingers have a blunt curved end with a reduced cross section width adjacent where joined to the second portion.

Some board to board contacts may be made in a more compact and altered version, as more clearly disclosed in FIG. 7 where the second portion of the contact is eliminated. That is, the first portion having the general barrel shape is joined directly to the third portion that encorporates the fingers forming the pin portion of the contact. Thus when so employed, the first portion is secured in the board to a depth of the barrel to make contact with the printed circuit formed on a face of the board.

Two or more circuit boards may be interconnected with the contacts of the invention. The third pin portion of one contact is inserted into the barrel shaped first portion of a second contact. The coined edges of the fingers produce a smooth wiping electrical contact which is also achieved through the flexing of the fingers.

The board to board contact of the invention provides a low cost one piece construction whereby printed circuit boards may be interconnected with each other or with ceramic chip platforms. The contacts provide the short electrical path from the board to board or chip to board. Once the contacts are plugged directly into a hole patttern of the board, a second board with corresponding contacts is plugged into the first portions of the board contacts. Additional boards may be plugged into the boards as desired.

Since the contact mates with itself rather than with a socket, no eyelet or plated holes is required in a board or a chip. The contact of the invention provides an integral unit which can function both as a male pin and as a female socket. This enables the board to be easily interconnected with another board which would not be possible for a board that merely includes conventional plated holes since such a board would have no projecting pins to attach to another board.

BRIEF DESCRIPTION OF THE DRAWINGS

The detailed description of one preferred embodiment of the board to board contact is hereafter described with specific reference being made to the drawings in which.

DETAILED DESCRIPTION OF THE INVENTION

Figure 1:
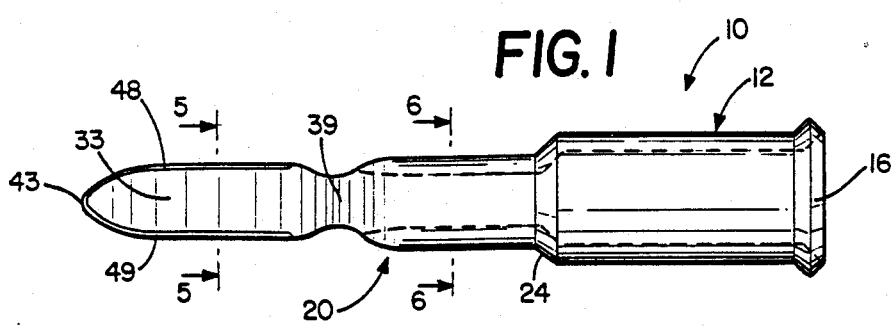
FIG. 1 is a side elevational view of a contact of the invention.
Figure 2:
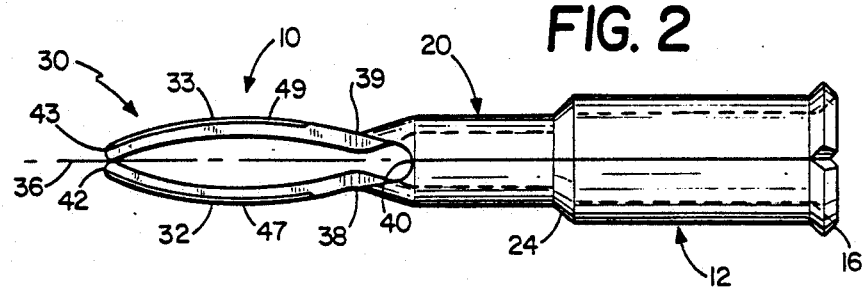
FIG. 2 is a side elevational view of the contact of FIG. 1 rotated 90°.
Figure 3:
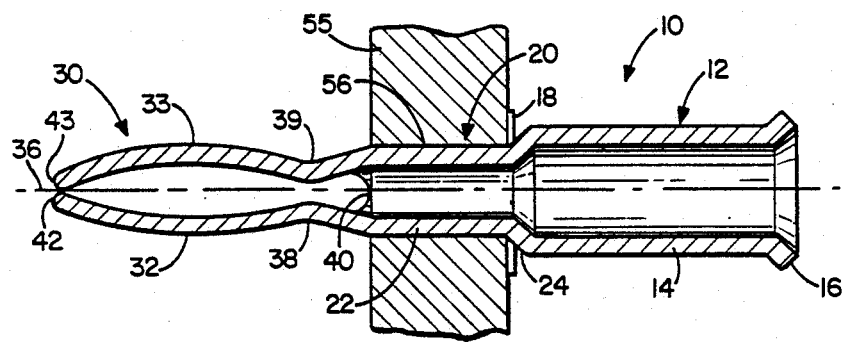
FIG. 3 is a cross-sectional view of the contact of the invention positioned within a bore of a printed circuit board.

The board to board contact 10 of the invention, as shown in FIGS. 1-3, generally includes three portions forming a unit.

The contact 10 is formed from a ribbon of metal combining high electrical conductivity, good formability and high strength. One metal found to be acceptable for this purpose is berylium copper of one-quarter hard temper which is heat treated for greater strength after the contacts are formed. The contacts are formed from a ribbon of beryllium copper having a thickness of about 0.0045 inches that may be wound on a reel.

Figure 4:
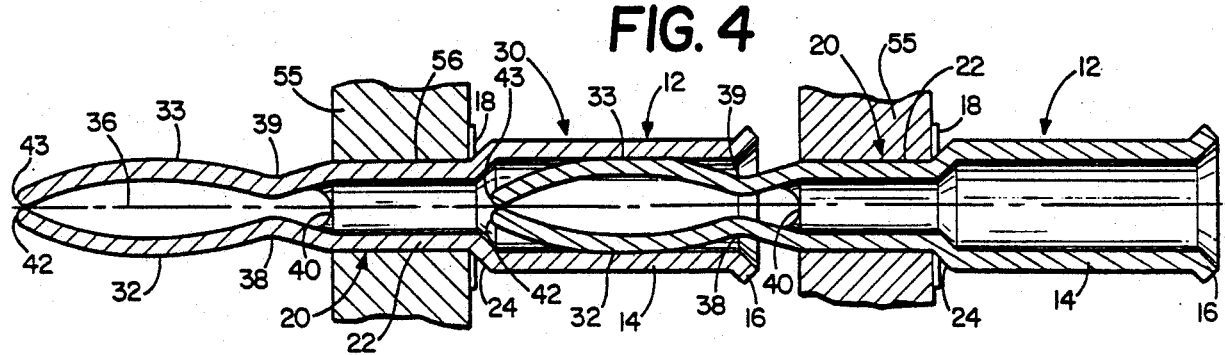
FIG. 4 is a cross-sectional view of the contacts of the invention interconnecting two printed circuit boards.
Figure 6:
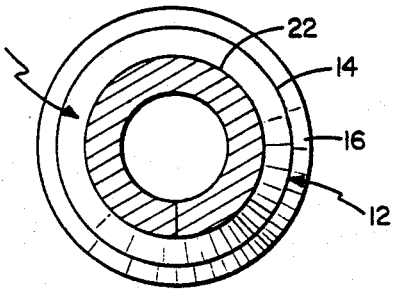
FIG. 6 is a sectional view of the first portion of the contact taken along line 6—6 of FIG. 1.

The first portion 12 is rolled into a generally barrel shape 14 as is best shown in FIG. 6. The end of first portion 12 preferably includes a turned-out rim 16 bevelled at about 45° to the longitudinal axis of barrel 14 to aid in guiding a second contact 10 within barrel 14 as shown in FIG. 4. The inside diameter of first portion 12 is preferably about 0.0225 inches.

The second portion 20 of the contact 10 communicates with the first portion 12 and has a general barrel shape 22 with an outside diameter preferably substantially equal to the inside diameter of first portion 12. The reduction in diameter is accomplished by a bevel or step 24 formed at approximately a 45° angle, and acts as a stop for the second portion as will be described more fully below.

The third portion 30 of contact 10 includes a pair of fingers 32 and 33 that extend parallel to a longitudinal axis 36 and are cantilevered and integrally formed from second portion 20. Fingers 32 and 33 have reduced width portions 38 and 39 adjacent second portion 20. When a load is applied to fingers 32 and 33, and they are within the barrel of another first portion 12 (as found in FIG. 4), a tensile stress is produced on the opposite inside faces of fingers 32 and 33. Associated with the tensile stress on the inside faces of fingers 32 and 33, a compressive stress is produced on the inside faces of fingers 32 and 33 at points near the reduced width portions 38 and 39, and at point 40. Somewhere between the points where a load is applied to fingers 32 and 33, and the reduced width portions 38 and 39, there is a point on the inside surfaces of fingers 32 and 33 where tensile stress changes to compressive stress and a zero bending stress is developed. This allows increased accomodation of nonparallelism of the axis of the second portion barrel 22 and the interior of the first portion of a second contact.

The tip ends 42 and 43 of fingers 32 and 33 are formed with a 0.005 inch radius where the remaining portion of the tip is formed with a 0.030 inch radius. The edge of each of fingers 32 and 33 preferably include a pair of coined edges 46 and 47 on finger 32 and 48 and 49 on finger 33 extending from the reduced portion to the tip ends 42 and 43.

Figure 8:
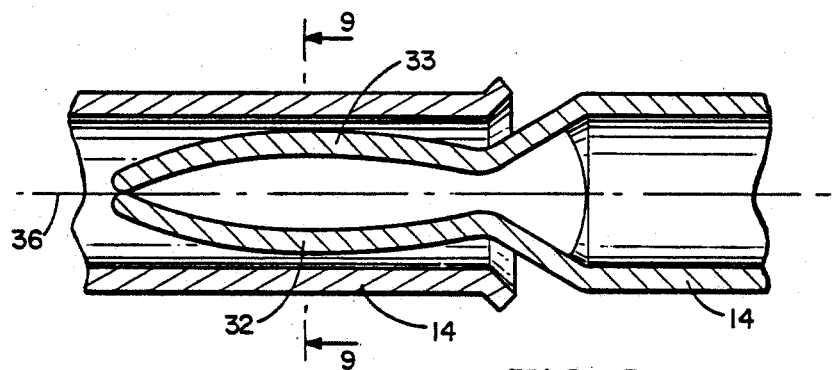
FIG. 8 is a partial sectional view of the fingers of the contact when held in a compressed position.
Figure 9:
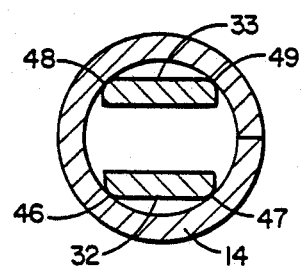
FIG. 9 is a cross-sectional view of the fingers of the contact taken along line 9—9 of FIG. 8.

The separation between fingers 32 and 33 is maybe about 0.004 inches. However, the separation may change and vary somewhat between different fingers. As the fingers 33 and 32 are inserted into barrel 12 of the other set of contacts, the exact separation will change as the coiled edges 46 and 47 on finger 32, and 48 and 49 on finger 33 engage the inside walls of barrel 12. That is, the exact width of each finger 32 or 33 will determine how high or low, above or below, the longitudinal axis 36 each finger is disposed and thus each separation between fingers 32 and 33 will vary somewhat. For a better understanding, reference is made to FIGS. 8 and 9.

Figure 5:
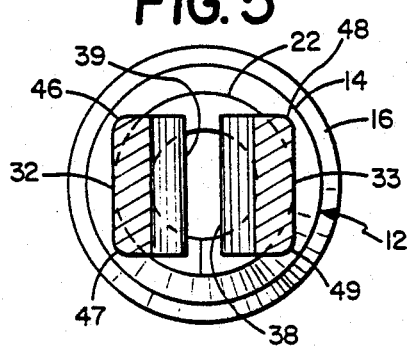
FIG. 5 is a sectional view of the fingers of the contact taken along line 5—5 of FIG. 1.

The contacts 10 of the invention are preferably formed from a reel of metal which is cut or stamped such that a plurality of unfolded and flat contacts are formed. The contacts are then formed through conventional processes forming the first portion barrel 14, second portion barrel 22 and the third portion 30 forming the fingers. The fingers are bent towards each other as shown in FIGS. 1 and 5, preferably such that tips 42 and 43 touch each other.

The formed contacts are preferably gold plated to produce the necessary good electrical characteristics. The electricl characteristics of the contacts are enhanced through the coined edges and the flexing of fingers 32 and 33. Fingers 32 and 33 may be somewhat askew with each other and through the reduced width portions 38 and 39, the fingers are brought into what may be generally considered to be parallel alignment as shown in FIG. 5.

Figure 7:
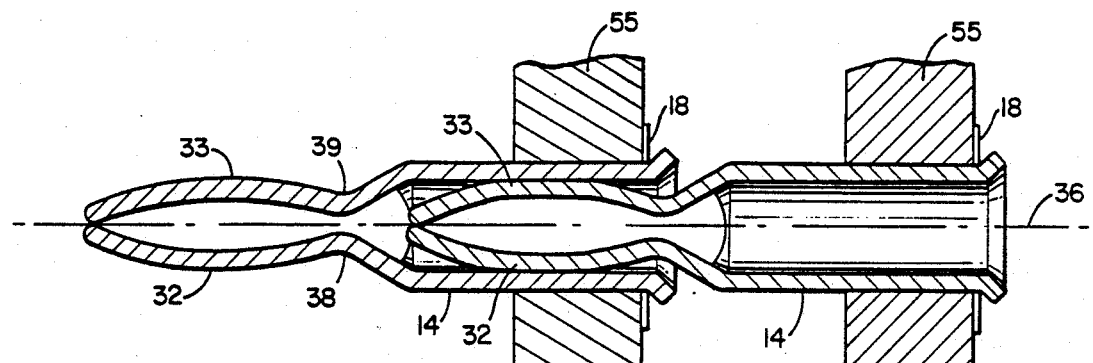
FIG. 7 is a cross-sectional view of the contacts of another embodiment of the invention in which two printed circuit boards are interconnected.

In operation, a contact 10 is inserted through a bore in a printed circuit board 55 or chip. As shown in FIGS. 3 and 4, second portion 20 is inserted into the hole until step 24 is contacted which prevents further insertion and provides a known depth. The tight friction fit of the second portion 20 with the hole provides an electrical contact with a printed circuit on the board as shown in FIGS. 3, 4, and 7.

In a typical board having a thickness of about 0.040 inches, third portion 30 preferably extends through the bore such that reduced width portions 38 and 39 are positioned below the circuit board 55. The entire length of contacts 33 and 32 [below the board] is about 0.080 inches.

A second, like board 55, with one or more printed circuit contacts 18 of the invention disposed around bore 56 [predetermined holes], is then attached to the first board contact 10. Depending on the orientation desired, a third portion of the contact may be inserted into first portion 12 of contact 10, such that the second board is above the first board.

In a similar manner, a third portion 30 of contact 10 may be inserted into the first portion of the second contact such that the first board is above the second. Thus, without modification, a board with contacts of the invention may be stacked in any desired order interconnecting a plurality of boards. A variation of this, may be found in FIG. 7 where the second portion 20 of each contact is eliminated, but the two contacts are secured one within the other.

In considering this invention, it should be remembered that the present disclosure is illustrative only, and that the scope of the invention should be determined by the appended claims.

What is claimed is:

1. A pair of flexible pins used in conjunction with each other for connecting a pair of printed circuit boards comprising:
(a) a first elongated sheet metal member having at least an initial and last portion defining a longitudinal axis;
(b) said initial portion having a barrel shape in which the lateral edges thereof are bent towards each other until they are in close proximity to each other;
(c) said last portion cantilevered integrally from said initial portion and extending away from said initial portion generally in the direction of said longitudinal axis, said last portion having a pair of fingers disposed in confronting relationship, one of which is the mirror image of the other, each finger having a curved configuration in which the greatest transverse projection of said fingers is at least equal to the width of the inside diameter of said initial portion;
(d) a first printed circuit board having electrical connections formed thereon and communicating with at least a single bore formed therethrough, said initial portion of said first member being disposed in said bore;

(e) a second elongated sheet metal member having at least an initial and last portion defining a longitudinal axis;

(f) a second printed circuit board having electrical connections formed thereon and communicating with at least a single bore formed therethrough;

(g) said initial portion of said second sheet metal member having at least an initial and last portion defining a longitudinal axis, said initial portion being disposed in said single bore of said second printed circuit board; and (h) said last portion of said second sheet metal member cantilevered integrally from said initial portion and extending away from said initial portion generally in the direction of said longitudinal axis, said last portion having a pair of fingers disposed in confronting relationship, one of which is the mirror image of the other, each finger having a curved configuration in which the greatest transverse projection of said fingers is at least equal to the width of the inside diameter of said initial portion of said first sheet metal member, said fingers being disposed within the confines of said initial portion of said first sheet metal member.

2. The structure defined in claim 1, wherein said fingers of said last portion of said first sheet metal member, and said fingers of said last portion of said second sheet metal member are reduced in width between the beginning of each said finger and the location of its greatest transverse projection.

3. The structure defined in claim 1, wherein the two outer edges of each of said fingers of said first and said second sheet metal members are coined.

4. A pair of flexible pins used in conjunction with each other for connecting a pair of printed circuit boards comprising:

(a) a first one-piece elongated sheet metal member having at least an initial and last portion defining a longitudinal axis;

(b) said initial portion having a barrel shape in which the lateral edges thereof are bent towards each other until they are in close proximity to each other;

(c) said last portion cantilevered integrally from said initial portion and extending away from said initial portion generally in the direction of said longitudinal axis, said last portion having a pair of cantilevered fingers disposed in confronting relationship, one of which is the mirror image of the other, each finger having a curved configuration in which the greatest transverse projection of said fingers is at least equal to the width of the inside diameter of said initial portion;

(d) a first printed circuit board having electrical connections formed thereon and communicating with at least a single bore formed therethrough;

(e) said single bore of said first printed circuit board receiving at least said initial portion of said first member;

(f) a second elongated sheet metal member having at least an initial and last portion defining a longitudinal axis;

(g) a second printed circuit board having electrical connections formed thereon and communicating with at least a single bore formed therethrough;

(h) said single bore of said second printed circuit board receiving at least said initial portion of said second member;

(i) said last portion of said second sheet metal member cantilevered integrally from said initial portion and extending away from said initial portion generally in the direction of said longitudinal axis, said last portion having a pair of cantilevered fingers disposed in confronting relationship, one of which is the mirror image of the other, each finger having a curved configuration in which the greatest transverse projection of said fingers is at least equal to the width of the inside diameter of said initial portion of said first sheet metal member, said fingers being disposed within the confines of said initial portion of said first sheet metal member.

5. The structure defined in claim 4, wherein said fingers of said last portion of said first sheet metal member, and said fingers of said last portion of said second sheet metal member are reduced in width between the beginning of each said fingers and the location of its greatest transverse projection.

6. The structure defined in claim 4, wherein the two outer edges of each of said fingers of said first and said second sheet metal members are coined.

7. A flexible pin for use in conjunction with another flexible pin comprising:

(a) a one-piece elongated sheet metal member having at least a first and a last portion defining a longitudinal axis;

(b) said first portion having a barrel shape in which the lateral edges thereof are bent towards each other until they are in close proximity to each other, and said first portion being constructed and arranged to receive and communicate with substantially all of another said last portion of another identical flexible pin;

(c) said last portion cantilevered integrally from said first portion and extending away from said first portion generally in the direction of said longitudinal axis, said last portion having a pair of cantilevered fingers disposed in confronting relationship, one of which is the mirror image of the other, each finger having a generally continuously arcuate cross-section in a plane parallel to said longitudinal axis in which the greatest transverse projection of said fingers is at least equal to the width of the inside diameter of said first portion; and (d) a printed circuit board having a plurality of bores formed therein communicating with electrical circuits formed thereon, one of said bores receiving said first portioN of said flexible pin.

8. A flexible pin for use in conjunction with another flexible pin comprising:

(a) a one-piece elongated sheet metal member having first, second and third portions defining a longitudinal axis;

(b) said first portion having a barrel shape in which the lateral edges thereof are bent towards each other until they are in close proximity to each other, and said first portion being constructed and arranged to receive and communicate with substantially all of another said third portion of another identical flexible pin;

(c) said second portion communicating with said first portion and having another barrel shape in which the outside diameter thereof is substantially equal to the inside diameter of the barrel of said first portion;

(d) said third portion cantilevered integrally from said second portion and extending away from said second portion generally in the direction of said longitudinal axis, said third portion having a pair of cantilevered fingers disposed in confronting relationship, one of which is the mirror image of the other, each finger having a generally continuously arcuate cross-section in a plane parallel to said longitudinal axis in which the greatest transverse projection of said fingers is at least equal to the width of the inside diameter of said first portion; and (e) printed circuit board having a plurality of bores formed therein communicating with electrical circuits formed thereon, one of said bores receiving said second portion of said flexible pin.

9. A pair of flexible pins used in conjunction with each other for connecting a pair of printed circuit boards comprising:

(a) a first one-piece elongated sheet metal member having at least an initial and last portion defining a longitudinal axis;

(b) said initial portion having a barrel shape in which the lateral edges thereof are bent towards each other until they are in close proximity to each other;

(c) said last portion cantilevered integrally from said initial portion and extending away from said initial portion generally in the direction of said longitudinal axis, said last portion having a pair of cantilevered fingers disposed in confronting relationship, one of which is the mirror image of the other, each fingers having a curved configuration in which the greatest transverse projection of said fingers is at least equal to the width of the inside diameter of said initial portion;

(d) a first printed circuit board having electrical connections formed thereon and communicating with at least a single bore formed therethrough;

(e) said single bore of said first printed circuit board being constructed and arranged to allow said last portion of said first member to pass therethrough;

(f) a second elongated sheet metal member having at least an initial and last portion defining a longitudinal axis;

(g) a second printed circuit board having electrical connections formed thereon and communicating with at least a single bore formed therethrough;

(h) said single bore of said second printed circuit board being constructed and arranged to allow said last portion of said second member to pass therethrough;

(i) said last portion of said second sheet metal member cantilevered integrally from said initial portion and extending away from said initial portion generally in the direction of said longitudinal axis, said last portion having a pair of cantilevered fingers disposed in confronting relationship, one of which is the mirror image of the other, each finger having a curved configuration in which the greatest transverse projection of said fingers is at least equal to the width of the inside diameter of said initial portion of said first sheet metal member, said fingers being disposed within the confines of said initial portion of said first sheet metal member;

(j) an intermediate portion of said first sheet metal member communicating between said initial and last portions having a barrel shape in which the outside diameter thereof is substantially equal to the inside diameter of the barrel of said initial portion, said intermediate portion communicating with said single bore formed in said first printed circuit board; and (k) a second intermediate portion of said second sheet metal member communicating between said initial and last portions having a barrel shape in which the outside diameter thereof is substantially equal to the inside diameter of the barrel of said initial portion, said intermediate portion communicating with said single bore formed in said second printed circuit board.

* * * * *

UNITED STATES PATENT AND TRADEMARK OFFICE
CERTIFICATE OF CORRECTION

PATENT NO. : 4,797,113
DATED : January 10, 1989
INVENTOR(S) : Roger T. Lambert

It is certified that error appears in the above-identified patent and that said Letters Patent is hereby corrected as shown below:

Claim 7: subparagraph (d), line 4, delete "portioN" and
substitute therefor -- portion --.

Claim 8: subparagraph (e), line 1, before "printed" insert --a--

Claim 9: subparagraph (c), line 7, delete "fingers" and
substitute therefor -- finger --.

Signed and Sealed this

Twenty-ninth Day of August, 1989

Attest:

DONALD J. QUIGG

*Attesting Officer*          *Commissioner of Patents and Trademarks*